United States Patent [19]

Ikeda

[11] Patent Number: 4,855,958

[45] Date of Patent: Aug. 8, 1989

[54] SEMICONDUCTOR INTEGRATED CIRCUIT DEVICE HAVING LOGIC MACRO AND RANDOM ACCESS MEMORY MACRO

[75] Inventor: Motohisa Ikeda, Kawasaki, Japan

[73] Assignee: Fujitsu Limited, Kanagawa, Japan

[21] Appl. No.: 233,093

[22] Filed: Aug. 17, 1988

[30] Foreign Application Priority Data

Aug. 19, 1987 [JP] Japan .............................. 62-205937

[51] Int. Cl.$^4$ ............................................. G11C 11/40
[52] U.S. Cl. ............................ 365/230.08; 365/189.08; 357/45
[58] Field of Search ..................... 365/189, 190, 230; 357/45

[56] References Cited

U.S. PATENT DOCUMENTS 4,419,746 12/1983 Hunter et al. ..................... 365/230

Primary Examiner—Terrell W. Fears
Attorney, Agent, or Firm—Armstrong, Nikaido, Marmelstein, Kubovcik & Murray

[57] ABSTRACT

A semiconductor integrated circuit device has a logic macro and RAM macros, and each RAM macro has a plurality of latch circuits, an operation circuit and a memory cell array. At least one of outputs of the latch circuits within the RAM macro is coupled to the operation circuit thereof by a first interconnection when the RAM macro is used. When the RAM macro is not used, all of the outputs of the latch circuits are coupled to certain internal cells of the logic macro by a second interconnection. The first and second interconnections are determined by a function to be carried out in the circuit device, that is, designed by CAD, for example, depending on the kind or model of the circuit device.

9 Claims, 12 Drawing Sheets

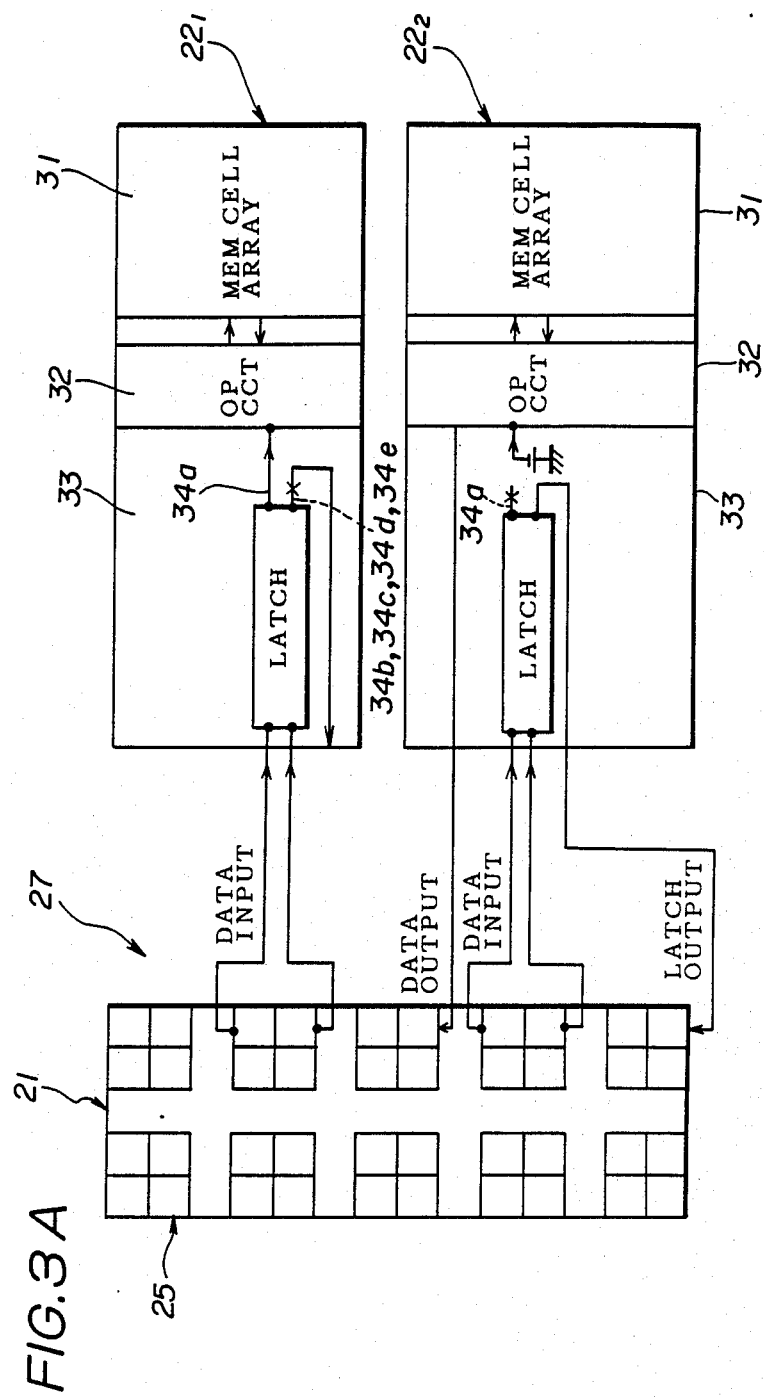

SEMICONDUCTOR INTEGRATED CIRCUIT DEVICE HAVING LOGIC MACRO AND RANDOM ACCESS MEMORY MACRO

BACKGROUND OF THE INVENTION

The present invention generally relates to semiconductor integrated circuit devices, and more particularly to a semiconductor integrated circuit device having a logic macro and random access memory (RAM) macros.

In the present specification, a logic macro refers to a group of logic gates constituted by cells, and a RAM macro refers to a group of memory cells and circuits making up a RAM device.

In semiconductor integrated circuit devices having a logic macro and RAM macros, there are cases where a large number of gates are required so as to improve the function of the circuit device. In addition, it is essential that the logic macro can be designed with ease.

When customizing a semiconductor integrated circuit device having a logic macro and a plurality of RAM macros by forming predetermined fixed interconnections thereon, all of the RAM macros may be used or at least one of the RAM macros may not be used.

FIG. 1 shows an essential part of the conventional semiconductor integrated circuit device having a logic macro and two RAM macros. In FIG. 1, a semiconductor chip 10 has a logic macro 11 and two RAM macros $12_1$ and $12_2$. A channel region 13 is provided between the logic macro 11 and the RAM macros $12_1$ and $12_2$ and between the mutually adjacent RAM macros $12_1$ and $12_2$.

The logic macro 11 has a plurality of latch circuits 15. On the other hand, each of the RAM macros $12_1$ and $12_2$ have a memory cell array 16, an X-address decoder driver 17, a Y-address decoder driver 18 and a sense/write amplifier 19.

Predetermined latch circuits 15 indicated by hatchings are used as latch circuits exclusively for use by the RAM macros $12_1$ and $12_2$, while unhatched latch circuits 15 are used as latch circuits exclusively for use by the logic macro 11.

An input data received from a gate array of the logic macro 11 is written into a predetermined memory cell of the memory cell array 16 by the sense/write amplifier 19 based on an address designated by the X-address decoder driver 17 and the Y-address decoder driver 18. An output data read out from the predetermined memory cell of the memory cell array 16 by the sense/write amplifier 19 based on the address designated by the X-address decoder driver 17 and the Y-address decoder driver 18 is outputted to the outside of the RAM macro. The predetermined latch circuits 15 indicated by the hatchings are used to synchronize the timings of various signals such as the address, the input data and a write enable signal to a clock signal.

The interconnections connecting the predetermined latch circuits 15 indicated by the hatchings to the RAM macros $12_1$ and $12_2$ are fixed regardless of the kind or model of the semiconductor integrated circuit device, that is, the function to be carried out in the circuit device, and the interconnections cannot be changed.

On the other hand, the number of logic gates provided in the logic macro 11 is generally determined by the size of the RAM macros $12_1$ and $12_2$, the size of the semiconductor chip 10 and the like. There are cases where latch circuits are required in the logic macro 11 in order to match timings of signals. In such cases, the latch circuits are provided in the logic macro 11, and a region within the logic macro 11 where the gates may be provided is reduced by the area occupied by the latch circuits. In other words, a region of the logic macro 11 is occupied by the predetermined latch circuits 15 indicated by the hatchings provided exclusively for use by the RAM macros $12_1$ and $12_2$, and the need to provide the required latch circuits in the logic macro 11 for use therein further reduces the region in which the gates of the logic macro 11 may be provided. For this reason, there are problems in that it is impossible to sufficiently increase the number of gates within the logic macro 11 and the freedom of design of the logic macro 11 is limited.

SUMMARY OF THE INVENTION

Accordingly, it is a general object of the present invention to provide a novel and useful semiconductor integrated circuit device having logic macro and random access memory (RAM) macro in which the problems described heretofore are eliminated.

Another and more specific object of the present invention is to provide a semiconductor integrated circuit device comprising a semiconductor chip, a logic macro provided on the semiconductor chip, the logic macro having a plurality of internal cells, and a plurality of random access memory macros provided on the semiconductor chip, where each of the random access memory macros have a latch circuit group including a plurality of latch circuits with inputs coupled to outputs of predetermined ones of the internal cells of the logic macro by fixed interconnections, an operation circuit and a memory cell array coupled to the operation circuit. At least a first random access memory macro out of the random access memory macros has outputs of all of the latch circuits thereof coupled to the operation circuit thereof by a first interconnection, and at least a second random access memory macro out of the random access memory macros has an output of at least one of the latch circuits coupled to certain internal cells of the logic macro by a second interconnection. According to the circuit device of the present invention, it is unnecessary to provide the latch circuits exclusively for use by the random access memory macro within the logic macro as was required in the conventional circuit device. In addition, it is possible to effectively utilize the unused latch circuits within the random access memory macro for use by the logic macro. Therefore, it is possible to provide a sufficiently large region within the logic macro for the latch circuits exclusively for use by the logic macro, and the freedom with which the logic macro may be designed is considerably improved over the conventional circuit device.

Other objects and further features of the present invention will be apparent from the following detailed description when read in conjunction with the accompanying drawings.

BRIEF DESCRIPTION OF THE DRAWINGS

FIGS. 3A and 3B are block diagrams respectively showing the logic macro and RAM macros of the embodiment shown in FIG. 2 for a first case where only one of the two RAM macros is used and a second case where both the two RAM macros are used;

DETAILED DESCRIPTION

Figure 1:
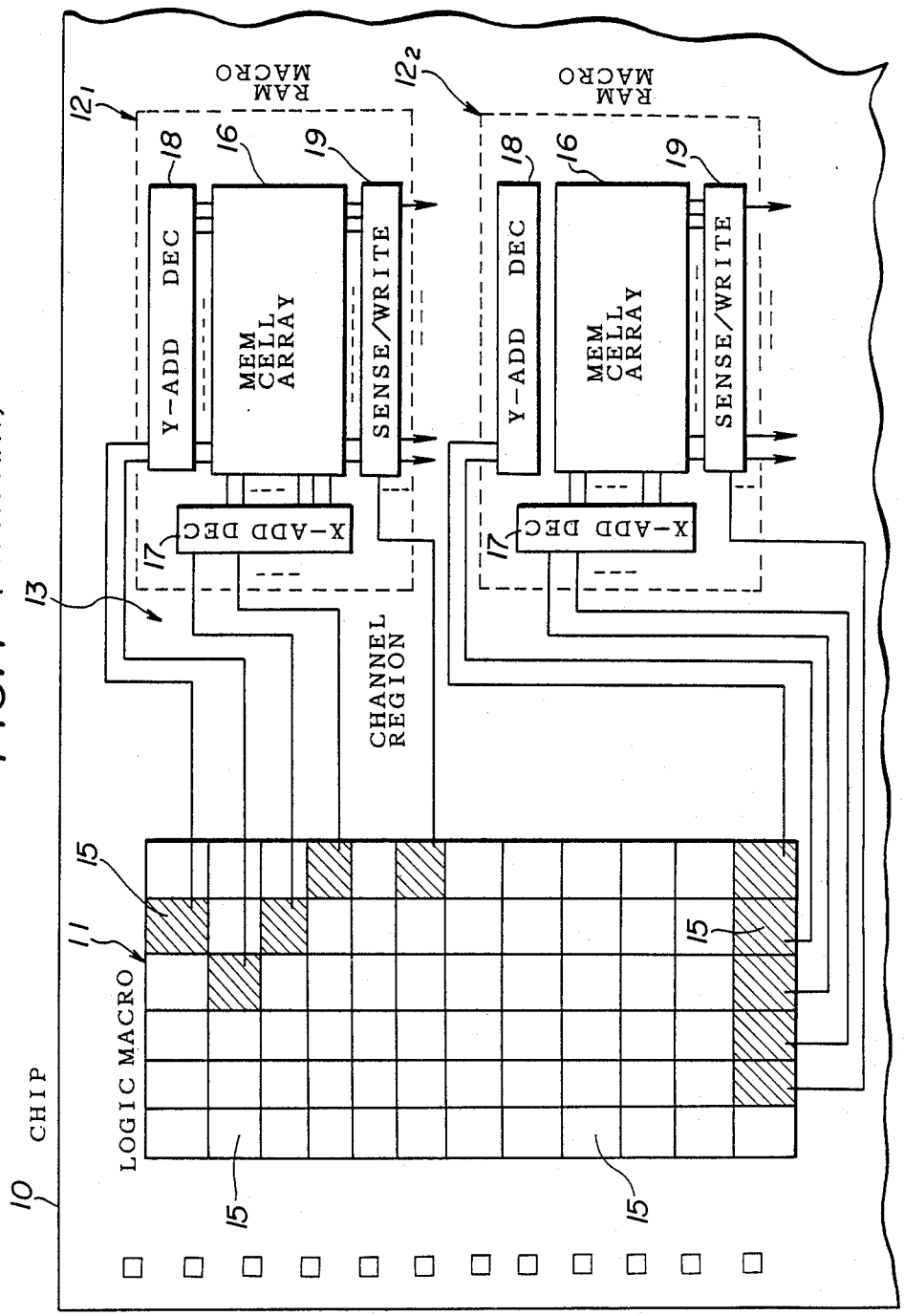
FIG. 1 is a block diagram generally showing the arrangement of the conventional semiconductor integrated circuit device having a logic macro and RAM macros.
Figure 2:
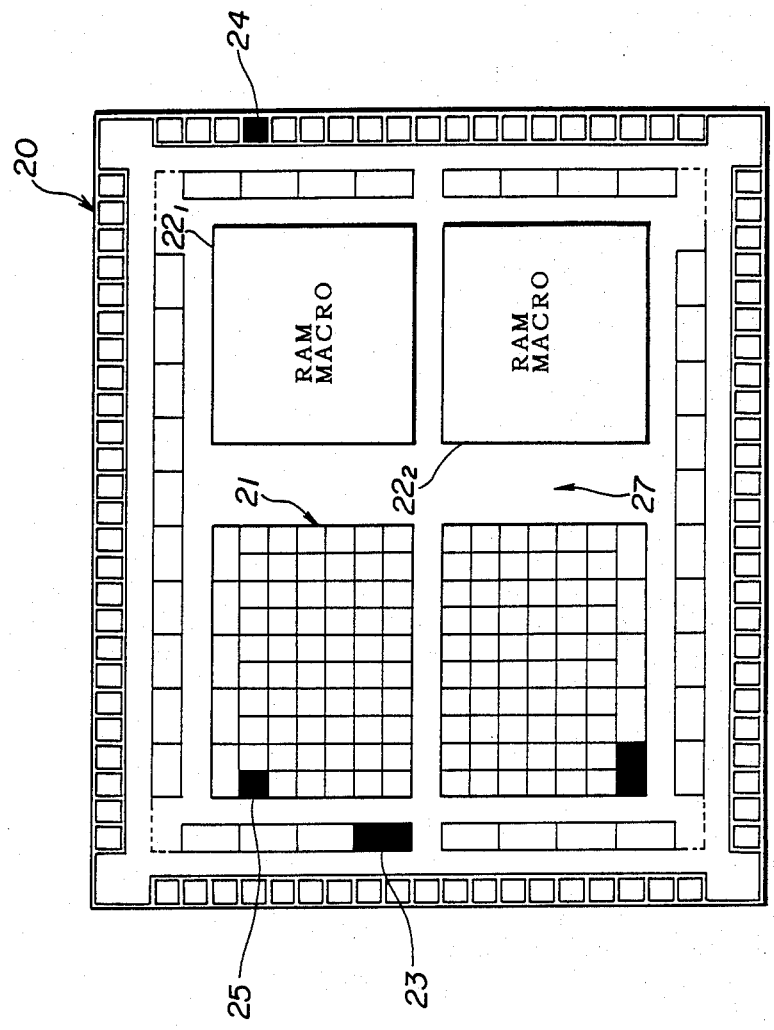
FIG. 2 generally shows the arrangement of an embodiment of the semiconductor integrated circuit device according to the present invention.

FIG. 2 generally shows the arrangement of an embodiment of the semiconductor integrated circuit device having a logic macro and RAM macros according to the present invention. In FIG. 2, a semiconductor chip 20 has a logic macro 21, two RAM macros $22_1$ and $22_2$, a plurality of external cells 23, and a plurality of pads 24. The logic macro 21 has a plurality of internal cells 25.

Figure 3B:
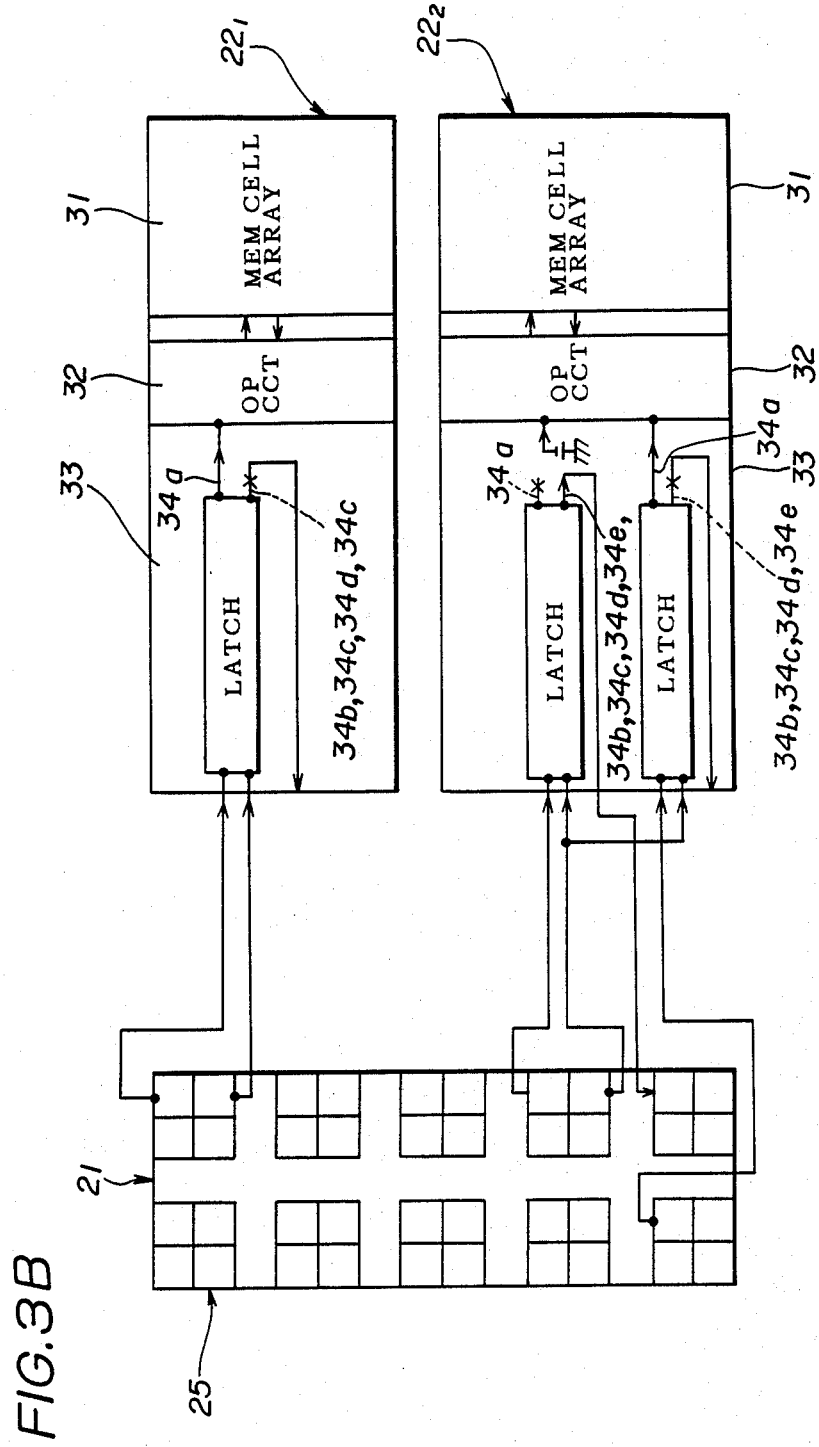

FIGS. 3A and 3B respectively show the logic macro 21 and the RAM macros $22_1$ and $22_2$ of the semiconductor chip 20 for a first case where only the RAM macro $22_1$ is used and a second case where both the RAM macros $22_1$ and $22_2$ are used. Each of the RAM macros $22_1$ and $22_2$ have a memory cell array 31, an operation circuit 32 and a latch circuit group 33. The operation circuit 32 includes an X-address decoder driver, a Y-address decoder driver, a sense/write amplifier and the like as in the case of the conventional RAM macro described before. The latch circuit group 33 includes a plurality of latch circuits (only one or two shown) having the same construction. A channel region 27 is provided between the logic macro 21 and the RAM macros $22_1$ and $22_2$ and between two mutually adjacent RAM macros $22_1$ and $22_2$.

Each latch circuit within the latch circuit group 33 has a portion of the interconnections on the output side thereof formed depending on the kind or model of the semiconductor integrated circuit device, that is, the function to be carried out in the circuit device. In other words, each latch circuit within the latch circuit group 33 has interconnections 34a, 34b, 34c, 34d and 34e which are selectively connected to the operation circuit 32 of the RAM macro or to gates of the logic macro 21 by computer aided design (CAD) for each kind or model of the semiconductor integrated circuit device, for example.

Figure 4:
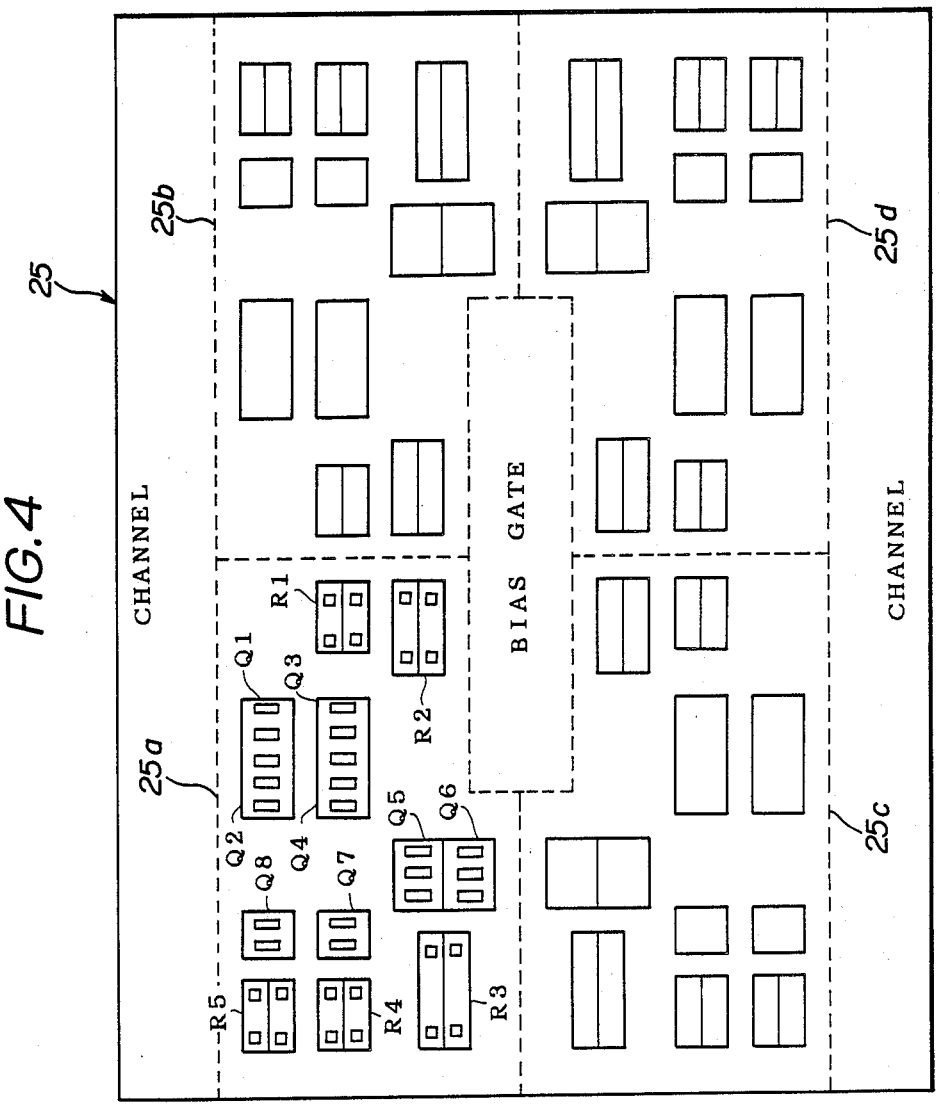
FIG. 4 shows the arrangement of gates of one cell within the logic macro.

For example, four gates 25a, 25b, 25c and 25d shown in FIG. 4 constitute one internal cell 25 of the logic macro 21.

When using the RAM macro, each latch circuit in the latch circuit group 33 has the interconnection 34a connected to the operation circuit 32 and the interconnections 34b through 34e disconnected from the gates of the logic macro 21. The RAM macro $22_1$ is used in FIGS. 3A and 3B and has such interconnections. However, even when the RAM macro is used, one or more latch circuits in the latch circuit group 33 may be unused. The unused latch circuit in the latch circuit group 33 has the interconnection 34a disconnected from the operation circuit 32 and the interconnections 34b through 34e connected to the gates of the logic macro 21, and in this case, an input signal of the operation circuit 32 corresponding to the unused latch circuit is fixed to a low level. In FIG. 3B, the RAM macro $22_2$ corresponds to such a RAM macro which is used but has an unused latch circuit.

On the other hand, when not using the RAM macro, each latch circuit in the latch circuit group 33 has the interconnection 34a disconnected from the operation circuit 32 and the interconnections 34b through 34e connected to the gates of the logic macro 21. An input signal of the operation circuit 32 corresponding to each latch circuit is fixed to a low level so as to prevent an erroneous operation of the memory cell array 31. In FIG. 3A, the RAM macro $22_2$ corresponds to such a RAM macro which is not used.

According to this embodiment, a portion of the interconnections on the output side of each latch circuit in the latch circuit group 33 is automatically designed for each kind or model of the semiconductor integrated circuit device by CAD, for example. Hence, only the interconnection 34a is connected to the operation circuit 32 of the RAM macro when using the RAM macro, and only the interconnections 34b through 34e are connected to the gates of the logic macro 21 when not using the RAM macro. Of course, in the case where one or more unused latch circuits exist in the RAM macro which is used, the interconnection 34a of the unused latch circuit is disconnected from the operation circuit 32 and the interconnections 34b through 34e of the unused latch circuit are connected to the gates of the logic macro 21.

As a result, the latch circuits of the RAM macro can be used as the latch circuits required in the logic macro 21 when the RAM macro is not used and the unused latch circuits of the RAM macro which is used can be used as the latch circuits required in the logic macro 21, without the need to provide the required latch circuits within the logic macro 21. Therefore, it is possible to effectively utilize the area of the logic macro 21 for the gates required therein without having to sacrifice space for the latch circuits required in the logic macro 21, and the logic macro 21 can be designed with a large degree of freedom unlike in the conventional semiconductor integrated circuit device.

Figure 5:
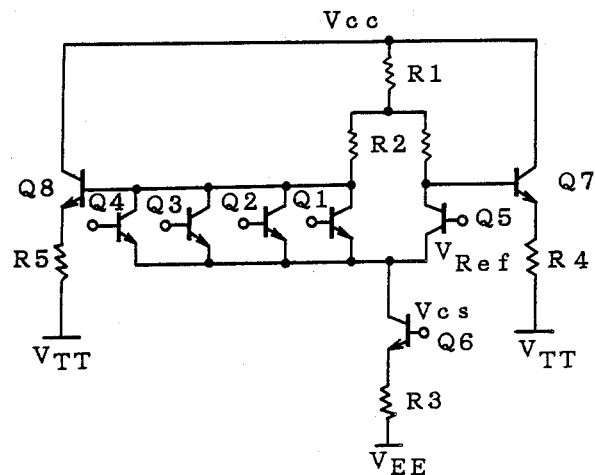
FIG. 5 is a circuit diagram showing a basic OR/NOR gate constituted within the logic macro.

FIG. 5 shows the circuit construction of a basic OR/NOR gate in the logic macro 21. For example, the basis OR/NOR gate shown in FIG. 5 corresponds to the gate 25a shown in FIG. 4. The basic OR/NOR gate has transistors Q1 through Q8 and resistors R1 through R5 which are connected as shown. In FIG. 5, $V_{CC}$, $V_{EE}$ and $V_{TT}$ denote power source voltages, $V_{Ref}$ denotes a reference voltage and $V_{CS}$ denotes a voltage. An input data to the basic OR/NOR gate is applied to the transistors Q1 through Q4.

Figure 6:
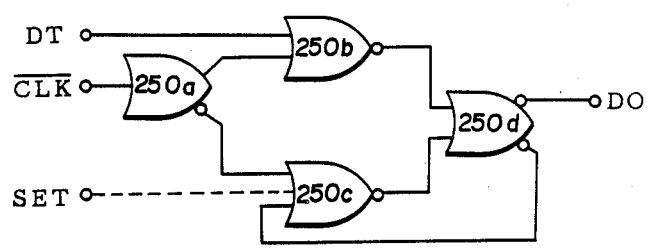
FIG. 6 is a circuit diagram showing a basic latch circuit constituted within the logic macro.

FIG. 6 shows a basic latch circuit constituted by four basic OR/NOR gates 250a through 250d respectively having the circuit construction shown in FIG. 5. In this case, the basic OR/NOR gates 250a through 250d correspond to the gates 25a through 25d of the internal cell 25 shown in FIG. 4. A set terminal may be provided as indicated by a phantom line.

Figure 7:
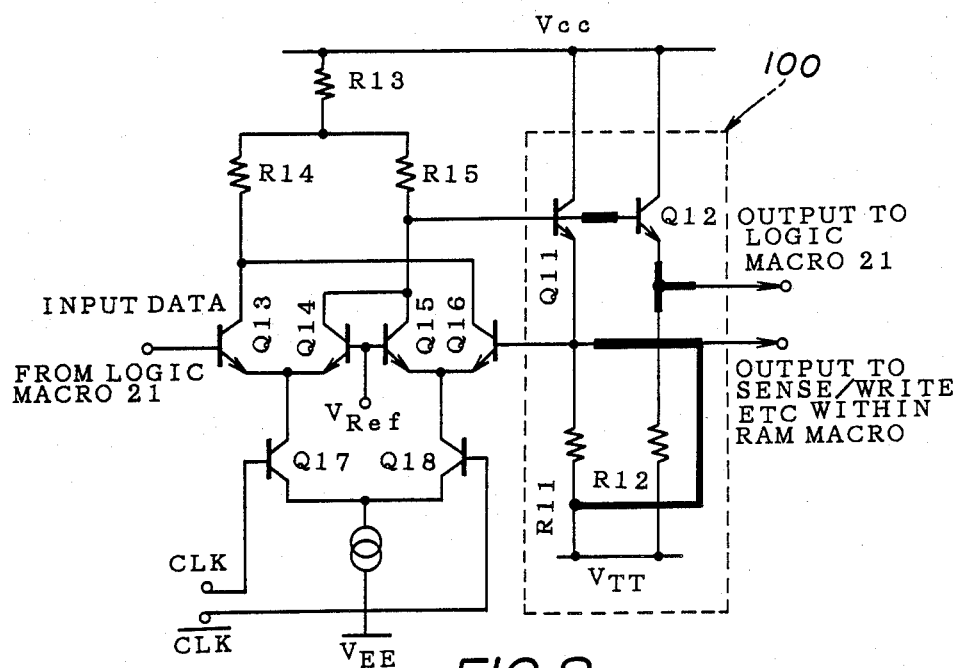
FIG. 7 is a circuit diagram showing a first embodiment of the circuit construction of one latch circuit within a latch circuit group of the RAM macros shown in FIGS. 3A and 3B.

FIG. 7 is a circuit diagram showing a first embodiment of the circuit construction of one latch circuit within the latch circuit group 33. The latch circuit has transistors Q11 through Q18 and resistors R11 through R15 which are connected as shown. When using the RAM macro which includes the latch circuit shown in FIG. 7, the input data from the logic macro 21 is latched in synchronism with a clock signal CLK from the logic macro 21 and is obtained from the transistor Q11 to be supplied to the sense/write amplifier and the like of the RAM macro. On the other hand, when not using the RAM macro, the input data from the logic macro 21 is latched in synchronism with the clock signal CLK from the logic macro 21 and is obtained from the transistor Q12 to be supplied to the logic macro 21. In FIG. 7, $V_{CC}$, $V_{EE}$ and $V_{TT}$ denote power source voltages, and $V_{Ref}$ denotes a reference voltage.

In regions other than a region 100 indicated by a phantom line in FIG. 7, the interconnections are fixed. However, in the region 100, a portion of the interconnections indicated by a bold line is formed depending on the kind or model of the semiconductor integrated circuit device by automatically designing the interconnection portion by CAD, for example.

Figure 8:
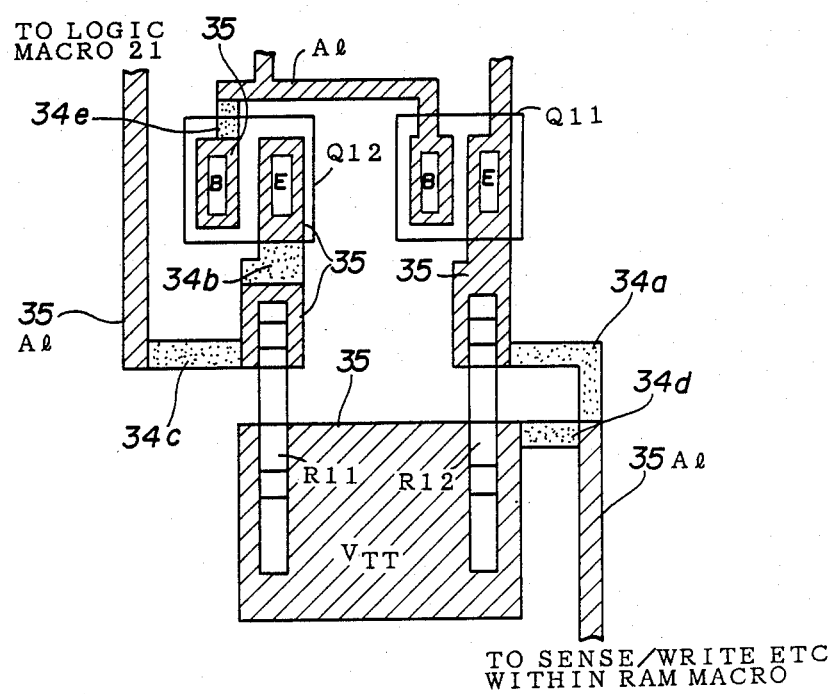
FIG. 8 is a plan view showing a pattern of an essential part of the circuit shown in FIG. 7.

FIG. 8 shows a pattern of the circuit within the region 100 shown in FIG. 7. In FIG. 8, fixed aluminum interconnections 35 are indicated by hatchings, and the interconnections 34a through 34e which are formed depending on the kind or model of the semiconductor integrated circuit device are indicated by shades.

Figure 10:
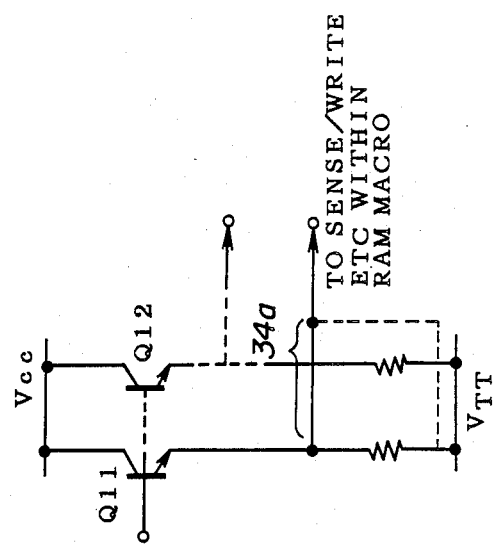
FIG. 10 is a circuit diagram showing an equivalent circuit for the case shown in FIG. 9.
Figure 9:
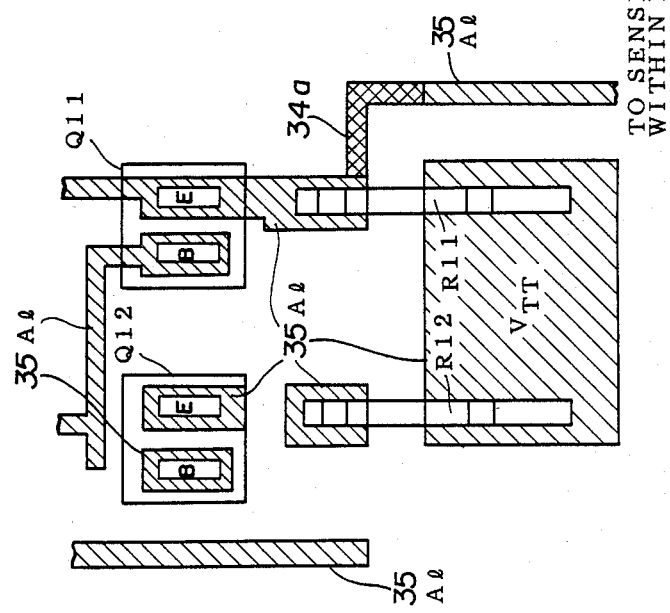
FIG. 9 is a plan view showing a pattern of the essential part of the circuit shown in FIG. 7 when the RAM macro is used.

FIG. 9 shows the pattern of the circuit within the region 100 shown in FIG. 7 when the RAM macro is used. In this case, the interconnecting 34a is used but the interconnections 34b through 34e are not used. Thus, the equivalent circuit becomes as shown in FIG. 10.

Figure 12:
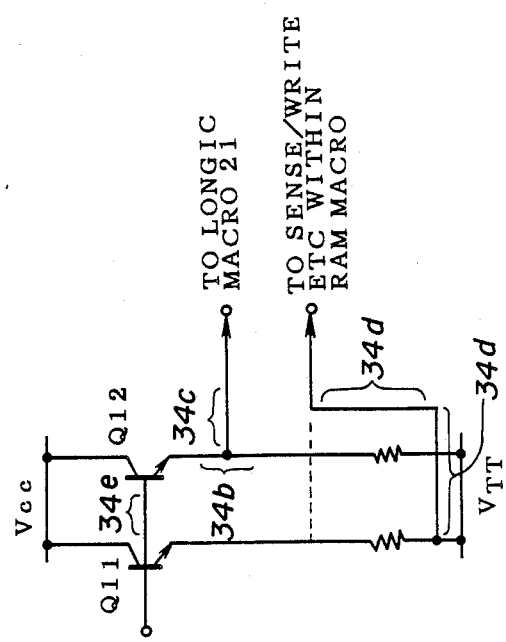
FIG. 12 is a circuit diagram showing an equivalent circuit for the case shown in FIG. 11.
Figure 11:
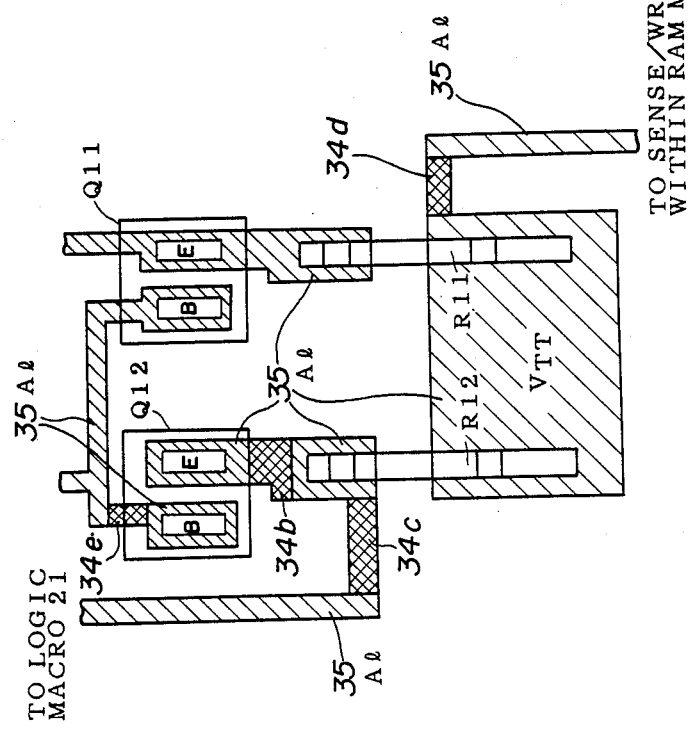
FIG. 11 is a plan view showing a pattern of the essential part of the circuit shown in FIG. 7 when the RAM macro is not used.

On the other hand, FIG. 11 shows the pattern of the circuit within the region 100 shown in FIG. 7 when the RAM macro is not used. In this case, the interconnections 34b through 34e are used but the interconnection 34a is not used. Hence, the equivalent circuit becomes as shown in FIG. 12. Even when the RAM macro is not used, the power source voltage $V_{TT}$ in the order of −2V is generally applied to the operation circuit 32. As described before, the RAM macro which is used may include one or more unused latch circuits with the region 100 having the pattern shown in FIG. 11.

Figure 13:
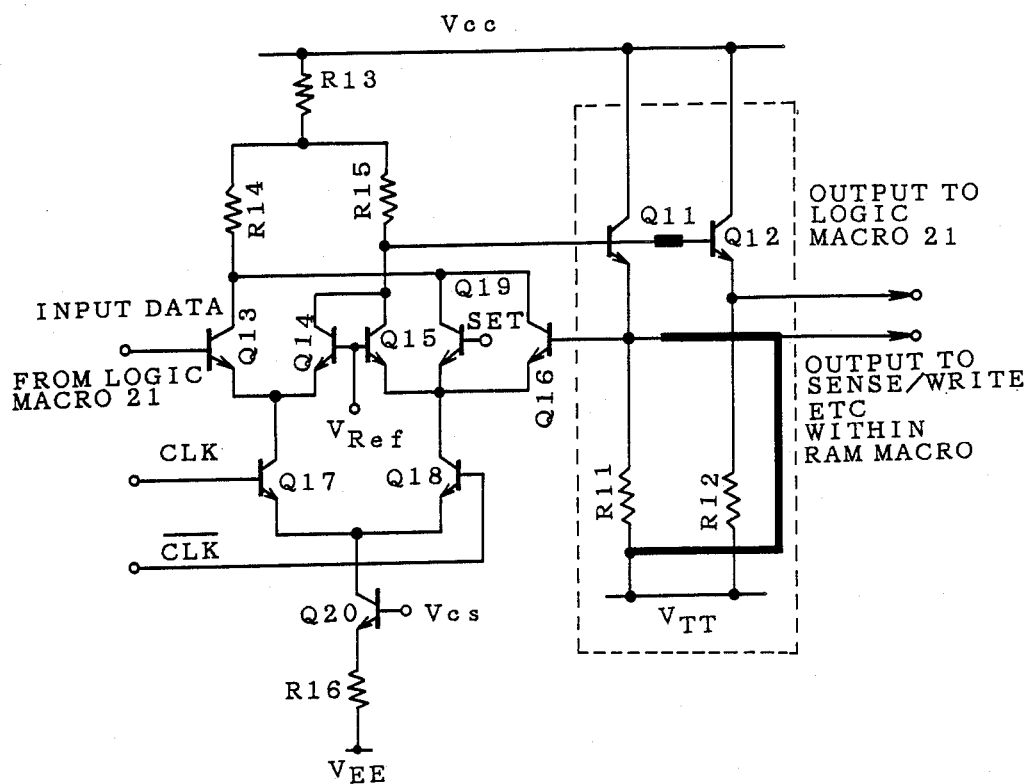
FIG. 13 is a circuit diagram showing a second embodiment of the circuit construction of one latch circuit within the latch circuit group of the RAM macro shown in FIGS. 3A and 3B.

Next, a description will be given of the circuit construction of a second embodiment of the latch circuit within the latch circuit group of the RAM macro shown in FIGS. 3A and 3B, by referring to FIG. 13. FIG. 13 is a circuit diagram showing the circuit construction of one latch circuit within the latch circuit group 33. In FIG. 13, those parts which are essentially the same as those corresponding parts in FIG. 7 are designated by the same reference numerals, and a description thereof will be omitted. The latch circuit additionally has transistors Q19 and Q20 and a resistor R16 which are connected as shown. A set signal is applied to the transistor Q19 and a voltage $V_{CS}$ is applied to the transistor Q20.

Figure 14:
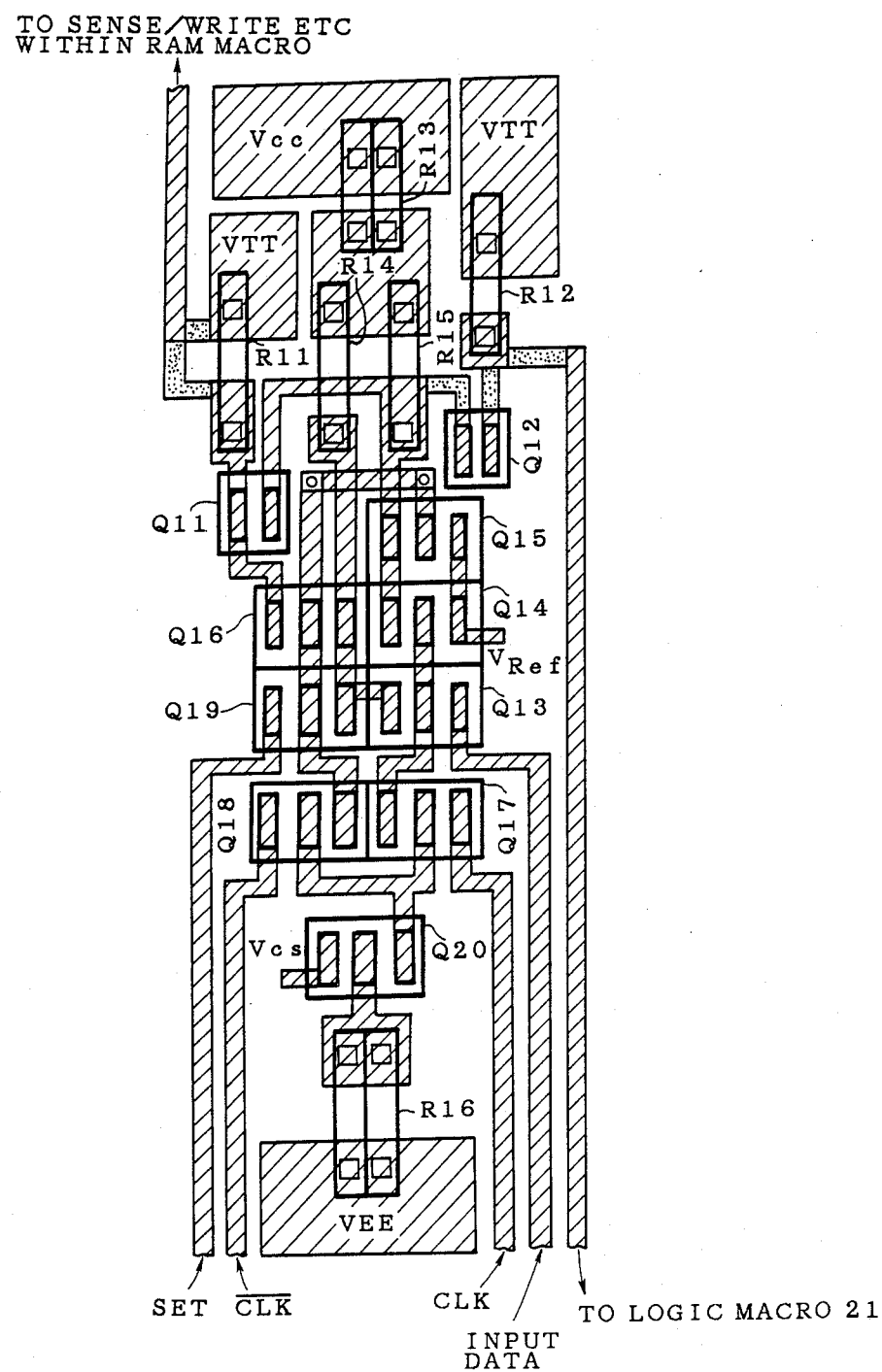
FIG. 14 is a plan view showing a pattern of the circuit shown in FIG. 13.

FIG. 14 shows an embodiment of the pattern of the latch circuit shown in FIG. 13 within the RAM macro. In FIG. 14, those parts which are the same as those corresponding parts in FIG. 13 are designated by the same reference numerals. As may be seen from FIG. 14, the latch circuit within the RAM macro can be provided within a small area compared to the latch circuit within the logic macro, because the transistors and resistors of the gates in each internal cell of the logic macro must be provided with a pattern having a relatively large marginal space between the elements to suit various kinds of interconnections while the marginal space between the elements constituting the latch circuit within the RAM macro can be small.

In regions other than the region 100 indicated by a phantom line in FIG. 13, the interconnections are fixed. However, in the region 100, a portion of the interconnections indicated by a bold line is formed depending on the kind or model of the semiconductor integrated circuit device by automatically designing the interconnection portion by CAD, for example.

Figure 15:
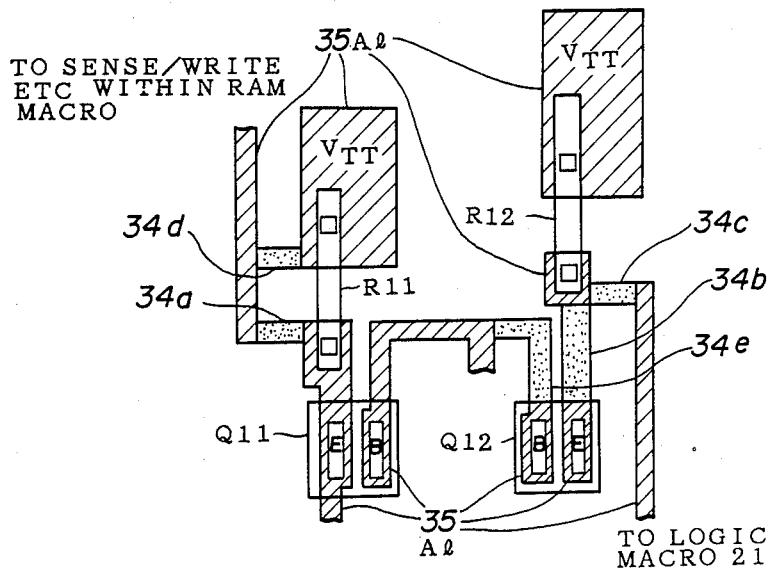
FIG. 15 is a plan view showing a pattern of an essential part of the circuit shown in FIG. 13.

FIG. 15 shows a pattern of the circuit within the region 100 shown in FIG. 13. In FIG. 15, fixed aluminum interconnections 35 are indicated by hatchings, and the interconnections 34a through 34e which are formed depending on the kind or model of the semiconductor integrated circuit device are indicated by shades.

Figure 16:
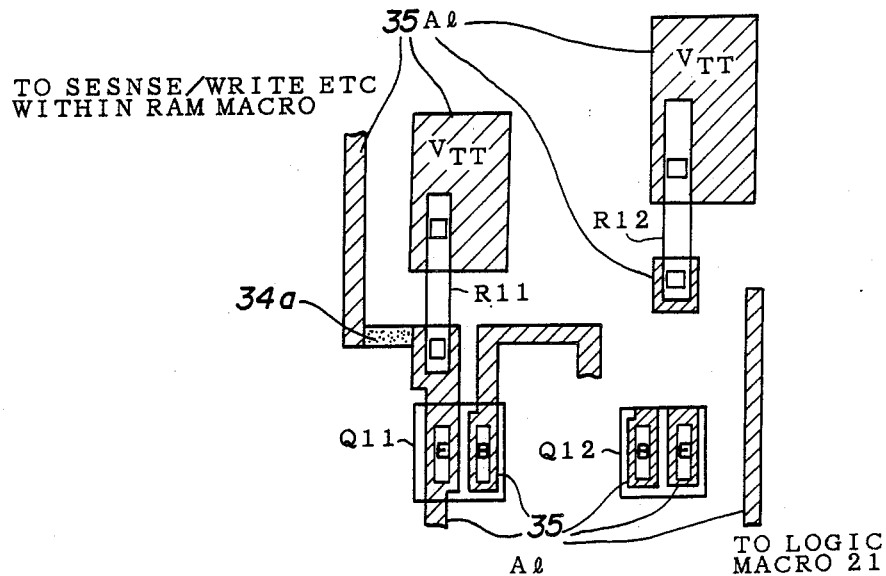
FIG. 16 is a plan view showing the pattern of the essential part of the circuit shown in FIG. 13 when the RAM macro is used.

FIG. 16 shows the pattern of the circuit within the region 100 shown in FIG. 13 when the RAM macro is used. In this case, the interconnection 34a is used but the interconnections 34b through 34e are not used.

Figure 17:
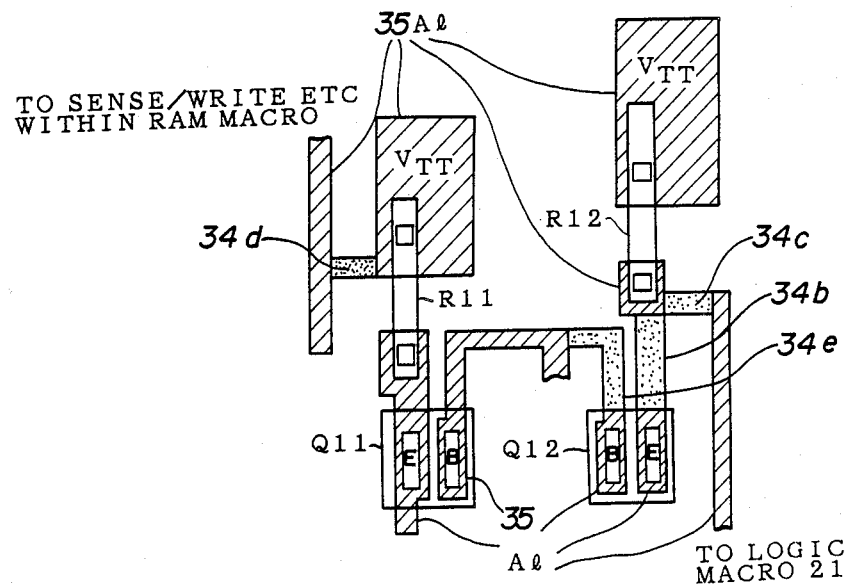
FIG. 17 is a plan view showing the pattern of the essential part of the circuit shown in FIG. 13 when the RAM macro is not used.

On the other hand, FIG. 17 shows the pattern of the circuit within the region 100 shown in FIG. 13 when the RAM macro is not used. In this case, the interconnections 34b through 34e are used but the interconnection 34a is not used. Even when the RAM macro is not used, the power source voltage $V_{TT}$ in the order of −2V is generally applied to the operation circuit 32. As described before, the RAM macro which is used may include one or more unused latch circuits with the region 100 having the pattern shown in FIG. 17.

In the described embodiments, only two RAM macros are provided in the semiconductor chip, but it is of couse possible to provide more than two RAM macros.

Further, the present invention is not limited to these embodiments, but various variations and modifications may be made without departing from the scope of the present invention.

What is claimed is:

1. A semiconductor integrated circuit device comprising:
   a semiconductor chip;
   a logic macro provided on said semiconductor chip, said logic macro having a plurality of internal cells; and a plurality of random access memory macros provided on said semiconductor chip, each of said random access memory macros having a latch circuit group including a plurality of latch circuits with inputs coupled to outputs of predetermined ones of the internal cells of said logic macro by fixed interconnections, an operation circuit and a memory cell array coupled to the operation circuit, at least a first random access memory macro out of said random access memory macros having outputs of all of the latch circuits thereof coupled to the operation circuit thereof by a first interconnection, at least a second random access memory macro out of said random access memory macros having an output of at least one of the latch circuits coupled to certain internal cells of said logic macro by a second interconnection.

2. A semiconductor integrated circuit device as claimed in claim 1 in which said first and second interconnections are determined by a function to be carried out by said semiconductor integrated circuit device, said fixed interconnections being fixed regardless of said function.

3. A semiconductor integrated circuit device as claimed in claim 1 in which both said first and second random access memory macros carry out a random access memory function, remaining ones of the latch circuits of said second random access memory macro having outputs coupled to the operation circuit thereof by said second interconnection.

4. A semiconductor integrated circuit device as claimed in claim 3 in which an input of the operation circuit of said second random access memory macro corresponding to said one of the latch circuits coupled to the certain internal cells of said logic macro by said second interconnection is fixed to a predetermined logic level.

5. A semiconductor integrated circuit device as claimed in claim 1 in which only said first random access memory macro carries out a random access memory function, all of the latch circuits of said second random access memory macro having outputs coupled to the certain internal cells of said logic macro by said second interconnection.

6. A semiconductor integrated circuit device as claimed in claim 5 in which inputs of the operation circuit of said second random access memory macro are fixed to a predetermined logic level.

7. A semiconductor integrated circuit device as claimed in claim 1 in which each of the latch circuits within said random access memory macros occupy an area smaller than an area occupied by a latch circuit constituted by the internal cells within said logic macro.

8. A semiconductor integrated circuit device as claimed in claim 1 in which said at least one of the latch circuits having the output thereof coupled to the certain internal cells of said logic macro by said second interconnection constitutes a circuit part of said logic macro having a function independent of a random access memory function of said second random access memory macro.

9. A semiconductor integrated circuit device as claimed in claim 1 in which said operation circuit includes an X-address decoder driver, a Y-address decoder driver and a sense/write amplifier.

* * * * *